United States Patent
Preuss et al.

(10) Patent No.: US 7,255,569 B1
(45) Date of Patent: Aug. 14, 2007

(54) CONNECTOR SYSTEM FOR MATING MULTIPLE VARIANT CIRCUIT CARDS WITH A FIXED CIRCUIT BOARD

(75) Inventors: Marc Armah Preuss, Ottawa (CA); Dion Pike, Stittsville (CA); Renato Devito, Stittsville (CA)

(73) Assignee: Alcatel Lucent, Paris (FR)

( * ) Notice: Subject to any disclaimer, the term of this patent is extended or adjusted under 35 U.S.C. 154(b) by 0 days.

(21) Appl. No.: 11/354,972

(22) Filed: Feb. 16, 2006

(51) Int. Cl.
*H01R 12/00* (2006.01)
(52) U.S. Cl. ............................................ 439/61; 385/24
(58) Field of Classification Search ............ 439/61–65; 385/24
See application file for complete search history.

(56) References Cited

U.S. PATENT DOCUMENTS

| | | |
|---|---|---|
| 5,547,386 A | 8/1996 | Fredberg |
| 5,896,473 A | 4/1999 | Kaspari |
| 6,392,142 B1 * | 5/2002 | Uzuka et al. ................ 174/541 |
| 6,855,001 B2 | 2/2005 | Goers |
| 7,083,422 B2 * | 8/2006 | Campini et al. .............. 439/61 |

* cited by examiner

*Primary Examiner*—Truc Nguyen
(74) *Attorney, Agent, or Firm*—Kramer & Amado, P.C.

(57) ABSTRACT

A system for coupling a variety of circuit cards to a circuit board, each circuit card having a respective function, the system comprising: a sequence of connectors mounted on the circuit board, each connector in the sequence of connectors having a respective function; and, one or more connectors mounted on a circuit card for mating with respective ones of the sequence of connectors mounted on the circuit board to thereby couple the circuit card to the circuit board, the respective function of the circuit card determining which ones of the sequence of connectors mounted on the circuit board that the one or more connectors mounted on the circuit card mates with; whereby space on the circuit card opposite ones of the sequence of connectors mounted on the circuit board that the one or more connectors mounted on the circuit card do not mate with is available for mounting components.

3 Claims, 3 Drawing Sheets

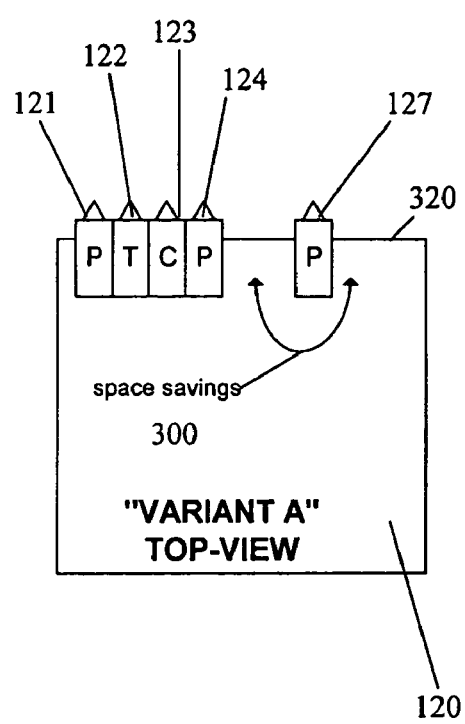
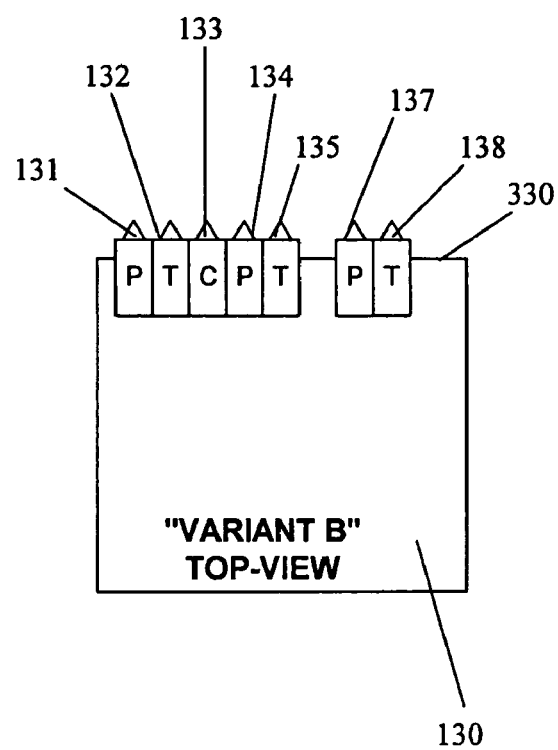
FIG. 3
FIG. 4

CONNECTOR SYSTEM FOR MATING MULTIPLE VARIANT CIRCUIT CARDS WITH A FIXED CIRCUIT BOARD

FIELD OF THE INVENTION

This invention relates to the field of circuit board connector systems, and more specifically, to a flexible connector system for mating multiple variant circuit cards with a fixed circuit board.

BACKGROUND OF THE INVENTION

Complex telecommunications systems are often of a modular design. Such systems may have an enclosure housing a base or fixed circuit board into which a number of differently configured or variant circuit cards may be inserted in a pluggable manner. The fixed circuit board typically has one or more multi-contact receptacle connectors into each of which a multi-contact plug connector on a variant circuit card may be inserted.

In some systems, the base or fixed circuit board may be provided with rear wiring which connects all the mating plug-in cards, and may be configured as a cable harness, as a winding bridge, or as a backplane. To allow a free choice of position or slot for any desired card, contacts of the same type on the base circuit board may be connected to one another to form a parallel bus. In such systems, the configuration of contacts on each card is identical and matches that of the base circuit board.

For example, U.S. Pat. No. 5,547,386 to Fredberg provides an apparatus adapted for coaction with a number of circuit boards. The apparatus has a backplane adapted for coaction with a number of circuit boards arranged in side-by-side relationship and including a number of mutually adjacent and mutually spaced elongated, narrow backplane-related connector fields, each of which is adapted for firm but easily removed mechanical and electrical coaction with a corresponding connector field related to an edge-part of respective circuit boards. A number of first selected backplane-related connector fields are connected electrically to a first bus, and a number of second selected backplane related connector fields are connected electrically to a second bus. The backplane-related connector fields are divided into a predetermined number of groups wherein each group is allotted a part-section of the backplane and wherein the first connector fields of respective groups are joined together and connect to the first bus. Each backplane-related group is allocated the same number of connector fields and each second connector field of each group are mutually joined and connect to the second bus. Also see U.S. Pat. Nos. 5,896,473 and 6,855,001 to Kaspari and Goers et al., respectively.

One problem with such systems is that they restrict the flexibility of card design. In particular, cards having different contact requirements must still mate with the standard contact arrangement on the base or fixed circuit board. This is wasteful as it causes an increase in the number of necessary contacts on each card and the complexity of the backplane wiring. In addition, the overall size of the connector on each card increases with the number of contacts required.

A need therefore exists for an improved connector system for mating variant circuit cards to a fixed circuit board. Accordingly, a solution that addresses, at least in part, the above and other shortcomings is desired.

SUMMARY OF THE INVENTION

According to one aspect of the invention, there is provided a system for coupling a variety of circuit cards to a circuit board, each circuit card having a respective function, the system comprising: a sequence of connectors mounted on the circuit board, each connector in the sequence of connectors having a respective function; and, one or more connectors mounted on a circuit card for mating with respective ones of the sequence of connectors mounted on the circuit board to thereby couple the circuit card to the circuit board, the respective function of the circuit card determining which ones of the sequence of connectors mounted on the circuit board that the one or more connectors mounted on the circuit card mates with; whereby space on the circuit card opposite ones of the sequence of connectors mounted on the circuit board that the one or more connectors mounted on the circuit card do not mate with is available for mounting components.

The sequence of connectors on the circuit board may be a repeated sequence of connectors. The repeated sequence of connectors may include at least two repetitions of the sequence of connectors. The sequence of connectors may be a connector for a power delivery function, a connector for a data traffic function, and a connector for a control function. The function of each connector in the sequence of connectors may be selected from the group consisting of a power delivery function, a data traffic function, and a control function. The sequence of connectors may be a linear sequence of connectors. The linear sequence of connectors may be disposed along an edge of the circuit board. The one or more connectors may be disposed along an edge of the circuit card. The connectors may be modular connectors. And, the connectors may be contacts.

BRIEF DESCRIPTION OF THE DRAWINGS

Further features and advantages of the embodiments of the present invention will become apparent from the following detailed description, taken in combination with the appended drawings, in which:

FIG. 3 is a top view illustrating the first variant circuit card of FIG. 1 in accordance with an embodiment of the invention; and, FIG. 4 is a top view illustrating the second variant circuit card of FIG. 2 in accordance with an embodiment of the invention.

It will be noted that throughout the appended drawings, like features are identified by like reference numerals.

DETAILED DESCRIPTION OF THE EMBODIMENTS

In the following description, details are set forth to provide an understanding of the invention. In some instances, certain circuits, structures and techniques have not been described or shown in detail in order not to obscure the invention.

Figure 1:
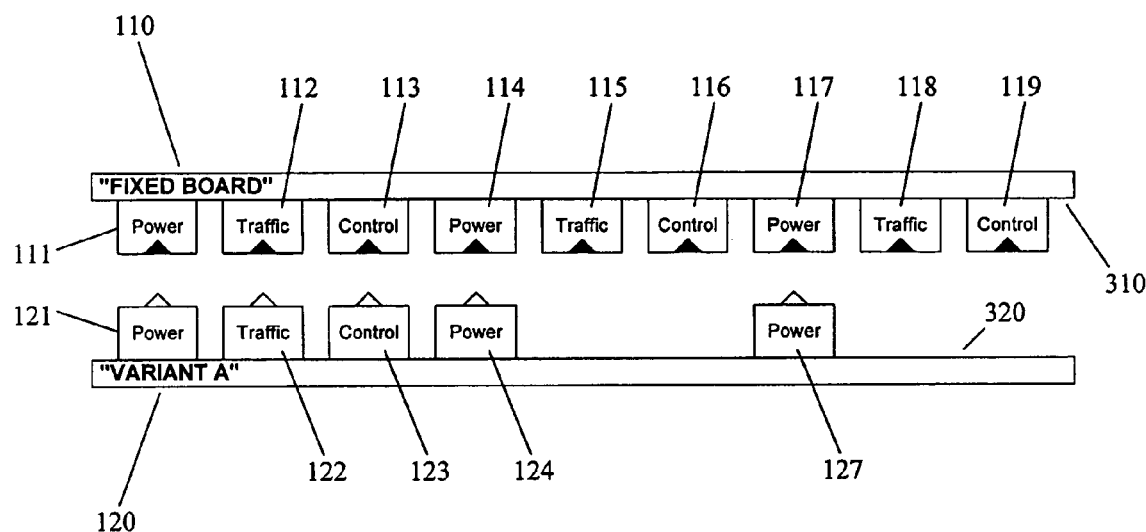
FIG. 1 is a partial top view illustrating the connectors of a fixed circuit board and mating connectors of a first variant circuit card in accordance with an embodiment of the invention.

FIG. 1 is a partial top view illustrating the connectors 111, 112, 113, 114, 115, 116, 117, 118, 119 of a fixed circuit board 110 and mating connectors 121, 122, 123, 124, 127 of a first variant ("Variant A") circuit card 120 in accordance with an embodiment of the invention. The board 110 and card 120 may form part of telecommunications system (not shown). Each of the board 110 and card 120 has mounted thereon various electronic components for performing a desired function. According to one embodiment, each connector on each of the board 110 and the card 120 may be a separate modular connector. According to another embodiment, each connector may be a contact. According to another embodiment, the connectors on the board 110 may form a single connector. According to another embodiment, selected groups of connectors (e.g., 111, 112, 113) on at least one of the board 110 and card 120 may form a single connector. Together, the connectors 111-119 of the fixed circuit board and the connectors 121-124, 127 of the variant circuit card 120 form a connector system 100.

In FIG. 1, when the card 120 is inserted into the board 110, the first power connector 121 on the card 120 mates with the first power connector 111 on the board 110, the first traffic connector 122 on the card 120 mates with the first traffic connector 112 on the board 110, the first control connector 123 on the card 120 mates with the first control connector 113 on the board 110, the second power connector 124 on the card 120 mates with the second power connector 114 on the board 110, and the third power connector 127 on the card 120 mates with the third power connector 117 on the board 110. While the board 110 has second and third traffic connectors 115, 118 and second and third control connectors 116, 119, the card 120 does not.

Figure 2:
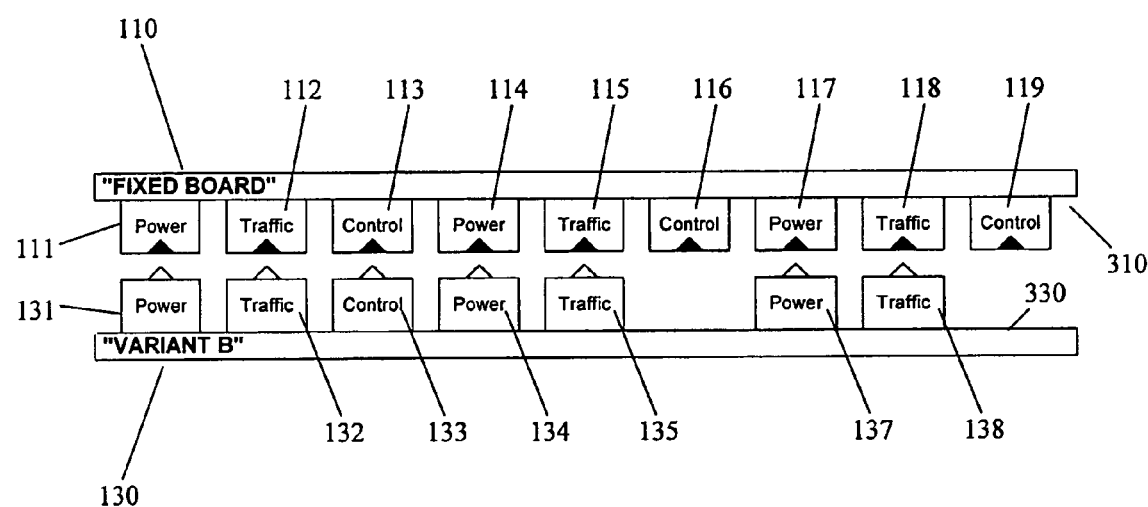
FIG. 2 is a partial top view illustrating the connectors of the fixed circuit board of FIG. 1 and mating connectors of a second variant circuit card in accordance with an embodiment of the invention.

FIG. 2 is a partial top view illustrating the connectors 111-119 of the fixed circuit board 110 of FIG. 1 and mating connectors 131, 132, 133, 134, 135, 137, 138 of a second variant ("Variant B") circuit card 130 in accordance with an embodiment of the invention. Again, the board 110 and card 130 may form part of telecommunications system. Each of the board 110 and card 130 has mounted thereon various electronic components for performing a desired function. According to one embodiment, each connector on each of the board 110 and the card 130 may be a separate modular connector. According to another embodiment, each connector may be a contact. According to another embodiment, the connectors on the board 110 may form a single connector. According to another embodiment, selected groups of connectors (e.g., 111, 112, 113) on at least one of the board 110 and card 130 may form a single connector. Together, the connectors 111-119 of the fixed circuit board and the connectors 131-135, 137-138 of the variant circuit card 130 form a connector system 100.

In FIG. 2, when the card 130 is inserted into the board 110, the first power connector 131 on the card 130 mates with the first power connector 111 on the board 110, the first traffic connector 132 on the card 130 mates with the first traffic connector 112 on the board 110, the first control connector 133 on the card 130 mates with the first control connector 113 on the board 110, the second power connector 134 on the card 130 mates with the second power connector 114 on the board 110, the second traffic connector 135 on the card 130 mates with the second traffic connector 115 on the board 110, the third power connector 137 on the card 130 mates with the third power connector 117 on the board 110, and the third traffic connector 138 on the card 130 mates with the third traffic connector 118 on the board 110. While the board 110 has second and third control connectors 116, 119, the card 130 does not.

The power connectors or contacts (e.g., 111, 121, 131) are for providing electrical power to the card 120, 130 from the board 110. The traffic connectors or contacts (e.g., 112, 122, 132) are for facilitating data flows between the board 110 to the card 120, 130. The control connectors or contacts (e.g., 113, 123, 133) are for passing control signals between the board 110 and the card 120, 130.

Referring to FIGS. 1 and 2, the Variant B card 130 has two more traffic connectors (i.e., 135, 138) than does the Variant A card 120. The function performed by the Variant B card 130, for example, may require the processing of more data or the switching to data traffic. However, both the Variant A card 120 and Variant B card 130 may be inserted into the common board 110.

Also referring to FIGS. 1 and 2, note that the board 110 has a repeating sequence of connector types or functions. From left to right along the board 110, the sequence is a power connector 111, followed by a traffic connector 112, followed by a control connector 113. This sequence is repeated three times on the board 110 of FIGS. 1 and 2 to form three groups of connectors as follows: first group (power 111, traffic 112, control 113), second group (power 114, traffic 115, control 116), and third group (power 117, traffic 118, control 119). The connectors on each of the mating cards 120, 130 follow the same sequence, albeit with various connectors missing from the sequence depending on the needs of the card 120, 130. In particular, the Variant A card 120 has the following groups of connectors: first group (power 121, traffic 122, control 123), second group (power 124, traffic (not required so not provided), control (not required so not provided)), and third group (power 127, traffic (not required so not provided), control (not required so not provided)). Similarly, the Variant B card 130 has the following groups of contacts: first group (power 131, traffic 132, control 133), second group (power 134, traffic 135, control (not required so not provided)), and third group (power 137, traffic 138, control (not required so not provided)). Of course the sequence of connector types may be other than that shown in FIGS. 1-2 (e.g., traffic-power-control, control-traffic-power, etc.). In addition, the board 110 and cards 120, 130 may include connectors having functions other than power, traffic, and control. Thus, the present invention provides a specification (or convention) for connector usage and positioning on a circuit board 110 and mating cards 120, 130 wherein the usage is grouped into three categories, those being power, control and traffic (data), and connectors from each group are positioned in an evenly distributed and interspersed manner along an edge 310, 320, 330 of the board 110 and cards 120, 130.

FIG. 3 is a top view illustrating the first variant ("Variant A") circuit card 120 of FIG. 1 in accordance with an embodiment of the invention. And, FIG. 4 is a top view illustrating the second variant ("Variant B") circuit card 130 of FIG. 2 in accordance with an embodiment of the invention. Because the Variant A card 120 does not require second and third traffic connectors (i.e., to mate with connectors 115 and 118 on the board 110) to perform its function, these connectors are not provided. Consequently, space savings 300 are provided for the card 120. These space savings 300 represent the area on the card 120 where the second and third traffic connectors would have been positioned had they have been required by the card 120. The area of the space savings 300 may be used to install additional components (not shown) on the card 120. A comparison of cards 120 and 130 as shown in FIGS. 3 and 4 indicates that the Variant A card 120 has additional surface area available over that of the Variant B card 130. Both the Variant A card 120 and the Variant B card 130, of course, also have space savings corresponding to the areas of these cards that are not required for connectors, each of these cards not requiring second and third control connectors (i.e., to mate with connectors 116 and 119 on the board 110).

Thus, according to the present invention, there is provided a connector system 100 having a fixed circuit board 110 that has the flexibility to allow multiple variants 120, 130 of a circuit card to connect to it while at the same time keeping connector count to a minimum on each variant. Each variant 120, 130 may require different amounts of power (i.e., current), traffic interface bandwidth, and control interface bandwidth. Advantageously, the present invention allows the connectors of each variant 120, 130 to be designed to meet the individual requirements of the variant 120, 130 rather than to meet the maximum requirements of all possible variants. In addition, each variant 120, 130 may have a unique number of connectors (e.g., 5 and 7, respectively, as shown in FIGS. 1-4) that may be less than the maximum number available (e.g., 9 as shown in FIGS. 1-2). This allows for cost savings as extraneous connectors are not required. This is particularly advantageous in high volume production situations. In addition, a reduced number of connectors increases usable space (e.g., 300) on cards and hence makes more potential card designs feasible.

According to the present invention, signals are combined into functional groups (i.e., power, data path, and control path interfaces) and are assigned to separate connectors (e.g., 111, 112, 113). The fixed circuit board 110 is designed to contain enough of these connectors to adequately provide power, traffic interface bandwidth, and control interface bandwidth to all possible variant cards 120, 130 that could connect to it. Each variant circuit card 120, 130 contains the minimum number of power, traffic, and control connectors it needs based on its own functionality. For example, consider the Variant A card 120 and the Variant B card 130 of FIGS. 1-2. The traffic requirements of Variant A 120 call for one traffic interface connector 122. Variant B 130 is a higher speed product that processes three times the traffic and therefore uses three traffic interface connectors 132, 135, 138. Variant A 120 does not require the two extra connectors and hence is not provided with them. This produces a cost and space savings 300 for Variant A 120. If the connectors had not been split along functional groups such as power, traffic, and control, then Variant A 120 might have needed the additional connectors because of important control signals or power requirements. The fixed board 110 can handle all current 120, 130 and future variant cards and can take advantage of economies of scale. Future variant cards have maximum flexibility with respect to their features/functionality as the present invention allows them to have any combination of connectors. Extra board space (e.g., 300) allows for more electronic components to be installed on the cards 120, 130 for the same foot-print, which translates into increased features/functionality. In addition, higher margins may be achieved by eliminating extraneous connectors on smaller cards.

The present invention provides several advantages over prior systems such as the Fredberg system described above. Fredberg provides a connector arrangement wherein connector fields are divided into groups and there can be subfields within a connector field. However, like connector fields of each group (e.g., first field) are joined together to form respective buses. Thus, Fredberg is much different from the present invention as the present invention does not require this type of interconnection, in fact it specifies the opposite. For example, in the present invention connectors used for control signals (e.g., 113, 116, 119) would not be interconnected to form a bus, since the individual signals from each of these connectors would typically be kept separate for control purposes. Likewise for connectors used for traffic (data) signals (e.g., 112, 115, 118) as multiple connectors of this type are used to achieve higher bandwidth.

In summary, according to one aspect of the invention, there is provided a system 100 for coupling a variety of circuit cards 120, 130 to a circuit board 110, each circuit card (e.g., 120) having a respective function, the system comprising: a sequence of connectors 117, 118, 119 mounted on the circuit board 110, each connector (e.g., 117) in the sequence of connectors 117, 118, 119 having a respective function; and, one or more connectors 127 mounted on a circuit card 120 for mating with respective ones 117 of the sequence of connectors 117, 118, 119 mounted on the circuit board 110 to thereby couple the circuit card 120 to the circuit board 110, the respective function of the circuit card 120 determining which ones 117 of the sequence of connectors 117, 118, 119 mounted on the circuit board 110 that the one or more connectors 127 mounted on the circuit card 120 mates with; whereby space 300 on the circuit card 120 opposite ones of the sequence of connectors mounted on the circuit board 110 that the one or more connectors mounted on the circuit card 120 do not mate with (e.g., 118, 119) is available for mounting components (not shown).

The sequence of connectors 117-119 on the circuit board 110 may be a repeated sequence of connectors 111-113, 114-116, 117-119. The repeated sequence of connectors may include at least two repetitions 111-113, 114-116 of the sequence of connectors 117-119. The sequence of connectors 117-119 may be a connector for a power delivery function 117, a connector for a data traffic function 118, and a connector for a control function 119. The function of each connector in the sequence of connectors 117-119 may be selected from the group consisting of a power delivery function, a data traffic function, and a control function. The sequence of connectors 117-119 may be a linear sequence of connectors. The linear sequence of connectors may be disposed along an edge 310 of the circuit board 110. The one or more connectors 127 may be disposed along an edge 320, 330 of the circuit card 120, 130. The connectors (e.g., 117, 127) may be modular connectors. And, the connectors (e.g., 117, 127) may be contacts.

The embodiments of the invention described above are intended to be exemplary only. Those skilled in this art will understand that various modifications of detail may be made to these embodiments, all of which come within the scope of the invention.

What is claimed is:

1. A circuit board adapted for mating with a plurality of circuit cards, each of the plurality of circuit cards including a plurality of electrical connectors having grouped functions, at least two of the plurality of circuit cards having different arrangements of the electrical connectors having grouped functions, the circuit board comprising:

a plurality of groups of electrical connectors adapted for mating with electrical connectors of at least one of the plurality of circuit cards, each of the plurality of groups of electrical connectors including at least a first function connector electrically connected to a first function electrical signal line and a second function connector electrically connected to a second function electrical signal line, wherein the first function of each group of electrical connectors is the same, the second function each group of electrical connectors is the same, the first function is different from the second function, every function electrical signal line is a separate and discrete electrical signal lines from every other function electrical signal line such that no two function electrical signal lines share a common bus, and the plurality of groups of electrical connectors are suitable for mating with each distinct arrangement of the electrical connections on the plurality of circuit cards while maintaining electrical signal connectivity of the first function and the second function.

2. The circuit board of claim 1, wherein each of the plurality of groups of electrical connectors further comprises a third function connector electrically connected to a third function electrical signal line, the third function of each of the plurality of groups of electrical connectors is the same, and the third function is different than both the first function and the second function.

3. The circuit board of claim 2, wherein the first function is a power delivery function, the second function is a data traffic function, and the third function is a control function.

* * * * *